United States Patent [19]
Hovel

[11] 4,292,461
[45] Sep. 29, 1981

[54] AMORPHOUS-CRYSTALLINE TANDEM SOLAR CELL

[75] Inventor: Harold J. Hovel, Katonah, N.Y.

[73] Assignee: International Business Machines Corporation, Armonk, N.Y.

[21] Appl. No.: 161,550

[22] Filed: Jun. 20, 1980

[51] Int. Cl.³ .......................................... H01L 31/04
[52] U.S. Cl. .................... 136/249; 136/255; 136/258; 357/2; 357/15; 357/30
[58] Field of Search .................. 136/249, 258, 255; 357/2, 15, 30

[56] References Cited

U.S. PATENT DOCUMENTS 4,017,332 4/1977 James ................................ 136/246
4,179,702 12/1979 Lamorte ............................. 357/30

OTHER PUBLICATIONS

Y. Hamakawa et al. "Optimum Design and Device Physics of the Horizontally Multilayered High Voltage Solar Cells Produced by Plasma Deposited Amorphous Silicon, " *Conf. Record,* 14th *IEEE Photovoltaic Specialists Conf.* (1980), pp. 1074–1079.

V. K. Dalal et al., "Design of Monolithic Multiple-Gap Amorphous Si-Ge Solar Cells", *Conf. Record,* 14th *IEEE Photovoltaic Specialists Conf.* (1980), pp. 1066–1069.

Y. Marfaing, "Evaluation of Multijunction Structures Using Amorphous Si-Ge Alloys", *Proceedings,* 2nd *European Community Photovoltaic Solar Energy Conference*, Berlin, Reidel Publishing Co. (1979).

Y. Hamakawa et al., "A New Type of Amorphous Silicon Photovoltaic Cell Generating More Than 20 V", *Appl. Phys. Lett.* vol. 35, pp. 187–189 (1979).

J. J. Hanak et al., "Development of Amorphous Silicon Stacked Cells", *Conf. Record,* 14th *IEEE Photovoltaic Specialists Conf.* (1980), pp. 1209–1211.

L. M. Fraas et al., "Design of High Efficiency Monolithic Stacked Multijunction Solar Cells", *Conf. Record,* 13th *IEEE Photovoltaic Specialists Conf.* (1978) pp. 886–891.

T. Mizrah et al., "Indium-Tin-Oxide Heterojunction Photovoltaic Devices", *IEEE Trans. Electron Devices,* vol. Ed–24, pp. 458–462 (1977).

V. K. Dalal, "Design Considerations for A-Si Solar Cells", *IEEE Trans. Electron Devices,* vol. Ed–27, pp. 662–670 (1980).

J. J. Hanak, "Progress Toward Large Area Amorphous Silicon Solar Cells", *Conf. Record,* 14th *IEEE Photovoltaic Specialists Conf.* (1980), pp. 623–628.

*Primary Examiner*—Aaron Weisstuch
*Attorney, Agent, or Firm*—Alvin J. Riddles

[57] ABSTRACT

A high efficiency tandem solar cell may be fabricated wherein a layer of transparent conducting material is placed over a crystalline substrate and under an amorphous region. Light incident on the upper surface has higher energy photons absorbed in the higher bandgap amorphous material and lower energy photons pass through the transparent conductor to a point of absorption in the lower energy gap crystalline material.

9 Claims, 2 Drawing Figures

4,292,461

AMORPHOUS-CRYSTALLINE TANDEM SOLAR CELL

DESCRIPTION

1. Technical Field

The technical field of the invention is that of solar energy converting devices wherein the energy from sunlight falling on the device is converted to electrical energy. Since the spectrum of solar energy provides photons of varying energies, a class of devices has developed in the art known as tandem solar cells wherein the sunlight passes serially through several regions of the solar cell and each separate region is tailored for efficient conversion to electrical energy of photons of a specific energy level. The tandem solar cells are usually constructed with regions of different energy gaps with a higher energy gap region adjacent to the surface through which the light enters the device and the lower energy gap regions are positioned further into the device since the lower energy photons penetrate deeper.

2. Background Art

Tandem solar cell structures have appeared in the art wherein materials of different bandgaps are used in different regions and such structures are shown, for example, in U.S. Pat. Nos. 4,179,702 and 4,017,332. Further, a tandem cell has been made up using polycrystalline semiconductor material which exhibits a higher energy gap for the upper layer and using monocrystalline semiconductor material which exhibits a lower energy gap for the lower layer. The efficiency and the circuit performance of such structures, however, have been limited heretofore in the art by the light transmission properties and the electrical properties of the structures. Moreover, in order to connect the separate solar cell regions in the tandem structure into electrical series, it is necessary to provide some means of making ohmic contact to each region, in a way which does not attenuate the light. Tunnel junctions are the most commonly suggested means for making the ohmic connection. For example, Fraas and Knechtli, in the 13th IEEE *Photovoltaics Specialists Conference,* page 886, show a tandem structure consisting of a p/n GaAs solar cell and a p/n Ge solar cell connected by an n+/p+ GaAs tunnel junction.

DISCLOSURE OF INVENTION

The solar energy converter of the invention is a tandem photovoltaic cell comprised of two photo-responsive junctions with a lower layer of a narrower bandgap crystalline material separated from a cover layer of a wider bandgap amorphous photo-responsive material by an optically transparent layer such as indium tin oxide that operates to form a rectifying contact to the crystalline material and an ohmic contact to the amorphous material.

When the structure of the invention is made of ribbon silicon overlaid with indium tin oxide which in turn is coated with plasma-deposited silicon, a high performance cell using inexpensive materials is the result.

The invention is directed to a structure wherein the two fundamental limits to the efficiency of solar cells, are reduced, i.e., the loss due to insufficient energy photons for conversion and the loss due to excess energy photons for conversion.

The tandem structure where amorphous semiconductor having a wider bandgap is placed on top of crystalline semiconductor with a lower bandgap in an electrical and optical configuration wherein the intermediate transparent conductor such as indium tin oxide serves for both electrical and optical properties provides an efficient approach to the solution of the problem, without incurring the difficulty or expense of providing a tunnel p/n junction.

In accordance with the invention it has been found that the crystalline material can be accpetably provided using the dendritic or ribbon type of material or in some cases by vapor depositing the material on a foreign substrate. The amorphous type of semiconductor material can be applied by such coating type techniques as sputtering, evaporation, plasma deposition, and low temperature vapor growth. An extremely efficient cell of the amorphous and crystalline type in accordance with the invention, can be made using the optical properties of indium tin oxide to provide an optically transparent electrical connecting layer between the crystalline substrate and the amorphous surface layer. The indium tin oxide has the property that it will form an ohmic contact with the amorphous material and will form a rectifying junction with p-type crystalline material or an ohmic contact with n-type crystalline material.

Figure 1:
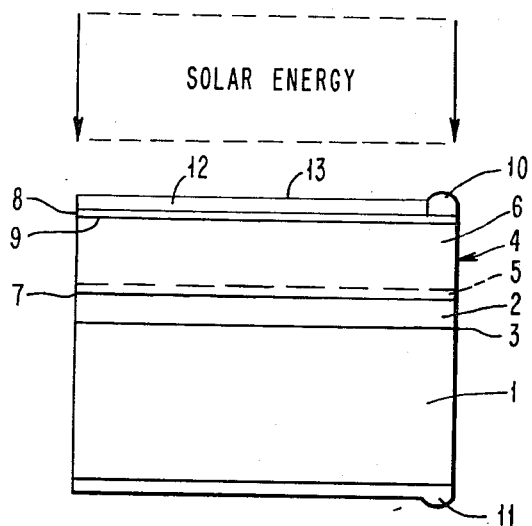
FIG. 1 is a schematic illustration of the relationship of the layers of the invention.

Referring to FIG. 1, a substrate 1 of crystalline p-type silicon is provided having an intermediate layer 2 of indium tin oxide which forms a photo-responsive rectifying junction 3 with the p-type crystalline material 1. Amorphous Si layer 4 is deposited on indium tin oxide layer 2. The region 5 of the amorphous Si layer 4 near the indium tin oxide layer 2 is doped n-type and the remainder 6 of the amorphous Si layer 4 is made intrinsic. Indium tin oxide layer 2 makes ohmic contact to the amorphous Si region 4 at the interface 7. A thin metal film 8 which is mostly transparent to visible light forms a photo-responsive Schottky barrier at interface 9 with the intrinsic region 6 of amorphous Si. Electrodes 10 and 11, respectively, are provided across which the output voltage appears. Anti-reflecting layer 12 is applied to minimize optical reflection loss from the surface 13.

The bottom electrode 11 may also serve as a reflective layer to reflect long wavelength light back through the silicon, enhancing the efficiency of electrical power generation.

In operation, the device of FIG. 1 has solar energy striking the surface 13 and since the amorphous material 4 has the higher energy gap the higher energy photons are absorbed within the amorphous layer 4. The lower energy photons pass through the amorphous material and are not significantly attenuated by the optical properties of the indium tin oxide 2 so that they are absorbed by the lower bandtap crystalline material 1. The electrical losses that usually occur in tandem devices are minimized by the electrical properties of the indium tin oxide that provides an ohmic contact at interface 7 to the amorphous material 5 and a rectifying junction 3 to the crystalline p-type silicon. The indium tin oxide 2 also has the property that it will form an ohmic contact to n-conductivity type silicon. This property is advantageous in that should it be desirable to provide a specific type of photo-responsive p/n junction by a technique such as diffusion in the crystalline silicon material 1, the indium tin oxide will then provide an ohmic contact to both the crystalline region 1 and the amorphous region 5.

In accordance with the invention, crystalline silicon material can be drawn by various processes into large area shapes such as ribbons, well known in the art, thereby providing fairly inexpensively a broad light receiving structure. It has been discovered that the material indium tin oxide has both optical and electrical properties for an excellent solar energy contact to silicon material. Where the crystalline silicon semiconductor material 1 is p-conductivity type, the indium tin oxide will form a rectifying junction. Where a p/n junction is already present, the indium tin oxide will form an ohmic contact with the n-conductivity type region and with the amorphous silicon. Other conducting transparent materials with properties similar to idiumtin oxide can be used in accordance with the principles of this invention. For example, tin oxide is also a transparent conductor and forms a good rectifying junction with n-type crystalline Si. Also, the photo-responsive amorphous Si device structure can be a $n^+$-intrinsic-$p^+$ variety in place of the $n^+$-i-Schottky barrier.

The conducting transparent material has good optical properties for not attenuating photons that pass through it. The amorphous silicon has a wider bandgap than the crystalline silicon and lends itself to application by coating types of deposition processes. It has been found that amorphous silicon exhibits a bandgap of 1.6 to 2 electron volts depending on the nature of the deposition process employed, whereas crystalline silicon, whether polycrystalline or monocrystalline, exhibits a bandgap of the vicinity of 1.1 electron volts. The structure of the invention provides a device with an efficiency of the order of 7–9% per individual cell with an overall efficiency of 14–18%.

BEST MODE FOR CARRYING OUT THE INVENTION

Figure 2:
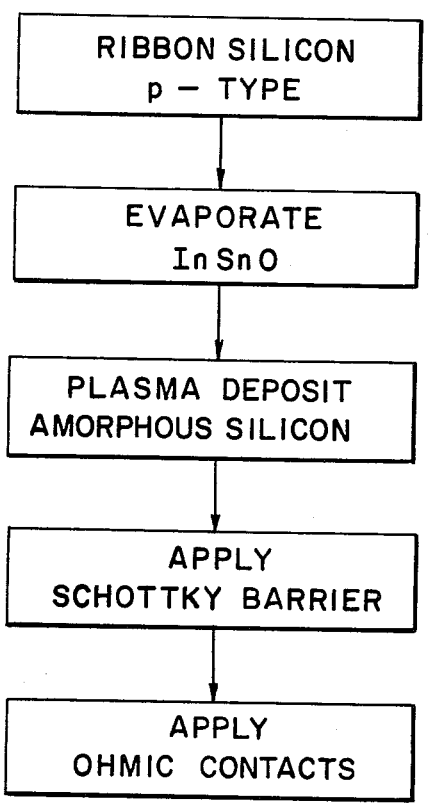
FIG. 2 is an illustration of the steps in the process of manufacture of the invention.

Referring to FIG. 2 a process is illustrated in top to bottom order for the fabrication of the device of FIG. 1. At the top of the figure in a first step a quantity of crystalline silicon such as ribbon silicon illustrated as 1 in FIG. 1 is provided. The ribbon silicon 1 is of p-conductivity type with a doping density in the vicinity of $10^{16}$. The second step involves placing a quantity of indium tin oxide in contact with the ribbon silicon. In this step the indium tin oxide may be applied by the inexpensive technique, for broad area application, of evaporation. The indium tin oxide evaporated to form a layer as 2 in FIG. 1 will form the rectifying junction 3 in FIG. 1. In the next step a layer of amorphous silicon 4 is then applied over the indium tin oxide layer 2. The amorphous silicon 4 contains an n-doped region 5 and an intrinsic region 6 as in FIG. 1. The properties of amorphous silicon are such that the broad area deposition technique of plasma deposition, well known in the art, will provide a satisfactory layer. The indium tin oxide layer 2 forms an ohmic contact with the amorphous silicon layer 5. In the next step a thin metal film 8 is then applied by, for example, evaporation over the light absorbing surface of the amorphous material to form the Schottky barrier 9.

In the next step the ohmic contacts 10 and 11 are applied to the metal film 8 and to the crystalline material 1 by a technique such as evaporation through a mask. Finally, an anti-reflection layer 12 such as $TiO_2$ is spray deposited or evaporated over the metal layer 8.

It should be noted that other transparent conducting materials such as tin oxide, tin antimony oxide, cadmium stannate, or zinc oxide can be substituted for the indium tin oxide, and that a p-i-n version of the amorphous Si device can be functionally substituted for the n-i-Schottky barrier version illustrated as elements 5, 4 and 9 in FIG. 1. Other crystalline materials such as Ge, GaSb, GaInAs, or InP can be substituted for the crystalline Si. Such materials may be polycrystalline or monocrystalline. Alternately, several low cost forms of crystalline Si may be used such as ribbon silicon, thin film Si polycrystalline films on foreign substrates, or cast polycrystalline Si.

It should further be noted that the thickness of the transparent conducting layer can affect the optical properties of the tandem structure because of the differing refractive indices of the crystalline layer, the transparent conducting layer, and the amorphous Si layer. The thickness of the transparent conducting layer should be chosen to minimize optical reflectance from the interface 3 for the wavelengths of light intermediate between the amorphous Si bandgap wavelength and the crystalline material bandgap wavelength. A computer analysis is required to predict the optical effects accurately, but an approximation can be made using greater wavelength principles. To minimize reflection for wavelengths between 0.7 μm and 1.1 μm, the transparent conducting layer, with a refractive index n of around 2, should have a thickness as set forth in Equation 1.

$$t \approx \lambda/4n \approx 0.2500 \; \mu m/2 \approx 0.1250 \; \mu m \qquad \text{Equation 1}$$

where λ is wavelength and n is the refractive index, for example.

although thicknesses somewhat higher (0.2 μm) can be tolerated and thicknesses as small as 0.01 μm may be acceptable because of the optical cavity nature of the amorphous Si/transparent conducting layer/crystalline substrate sandwich.

What has been described is a technique of providing a low cost high efficiency tandem solar cell wherein crystalline material and amorphous silicon material having different bandgaps are joined by an indium tin oxide intermediate layer which operates to provide a structure with improved optical and electrical properties that can be fabricated using not only inexpensive materials but also broad area inexpensive processes.

Having described the invention, what is claimd as new and what is desired to secure by letters patent is:

1. In a tandem solar cell device where solar energy passes through a plurality of superimposed layers of photo-responsive materials, each layer converting principally different energy photons, the improvement comprising in combination:

a crystalline semiconductor substrate layer having a photo-responsive junction associated therewith;

an optically transparent conducting layer chosen from the group consisting of indium tin oxide, tin oxide, tin antimony oxide, cadmium stannate, and zinc oxide over said crystalline semiconductor layer;

an amorphous silicon light receiving layer over said optically transparent conducting layer;

a photo-responsive junction associated with said amorphous silicon layer; and an ohmic contact to each of said amorphous Si solar cell structure and said crystalline semiconductor substrate layer.

2. The tandem solar cell device of claim 1 wherein said optically transparent conducting layer forms the photo-responsive junction to said crystalline substrate layer and an ohmic contact to said amorphous layer.

3. The tandem solar cell device of claim 1 wherein said optically transparent conducting layer is indium tin oxide and said crystalline semiconductor substrate layer is silicon.

4. The tandem solar cell device of claim 1 wherein said optically transparent conducting layer has a thickness in the range 0.01 $\mu$m to 0.2 $\mu$m.

5. The tandem solar cell device of claim 1 wherein said photo-responsive junction associated with said amorphous layer is a Schottky barrier.

6. In a tandem silicon solar cell structure where solar energy passes through a plurality of superimposed layers of photo-responive materials, each layer being principally responsive to different energy photons, the improvement comprising in combination:

a crystalline silicon substrate layer;

a photo-responsive junction associated with light receiving surface of said crystalline substrate layer;

an optically transparent indium tin oxide layer overlying the light receiving surface of said crystalline substrate layer;

an amorphous silicon layer over said indium tin oxide layer and forming an ohmic contact with said indium tin oxide layer;

a photo-responsive junction on the light receiving surface of said amorphous silicon layer opposite to said ohmic contact surfaces; and an ohmic contact to each of said crystalline layer and said amorphous layer.

7. The tandem solar cell structure of claim 6 wherein said photo-responsive junction associated with the light receiving surface of said crystalline substrate layer is formed by said indium tin oxide layer.

8. The tandem solar cell of claim 6 wherein said photo-responsive junction on said amorphous layer is a Schottky barrier.

9. The tandem solar cell of claim 6 wherein the thickness of said indium tin oxide layer is in the range 0.01 $\mu$m to 0.2 $\mu$m.

* * * * *